US008831236B2

(12) United States Patent
Yokoyama

(10) Patent No.: US 8,831,236 B2
(45) **Date of Patent: *Sep. 9, 2014**

(54) GENERATOR AND GENERATION METHOD OF PSEUDO-BASS

(75) Inventor: Yasutomo Yokoyama, Kyoto (JP)

(73) Assignee: Rohm Co., Ltd. (JP)

( * ) Notice: Subject to any disclaimer, the term of this patent is extended or adjusted under 35 U.S.C. 154(b) by 677 days.

This patent is subject to a terminal disclaimer.

(21) Appl. No.: 12/877,138

(22) Filed: Sep. 8, 2010

(65) Prior Publication Data

US 2011/0317850 A1 Dec. 29, 2011

(30) Foreign Application Priority Data

Sep. 9, 2009 (JP) ................................ 2009-208575
Aug. 10, 2010 (JP) ................................ 2010-179653

(51) Int. Cl.
*H03G 3/00* (2006.01)
*H03G 5/00* (2006.01)

(52) U.S. Cl.
USPC ............................................. 381/61; 381/98

(58) Field of Classification Search
USPC ................. 381/98, 94.1, 61, 58; 84/622, 625
See application file for complete search history.

(56) References Cited

U.S. PATENT DOCUMENTS 8,150,067 B2 * 4/2012 Ohkuri et al. .................. 381/98
8,180,071 B2 * 5/2012 Yamazaki et al. ............. 381/98
2010/0086147 A1 * 4/2010 Hung ............................. 381/98
2010/0215192 A1 * 8/2010 Minnaar ........................ 381/98
2013/0177171 A1 * 7/2013 Yokoyama ..................... 381/98

FOREIGN PATENT DOCUMENTS

JP 2005-318598 A 11/2005
JP 2008-304670 A 12/2008
JP 2009-044655 A 2/2009

* cited by examiner

*Primary Examiner* — Vivian Chin
*Assistant Examiner* — Ammar Hamid
(74) *Attorney, Agent, or Firm* — Cantor Colburn LLP

(57) ABSTRACT

An absolute-value circuit outputs the absolute value of a signal SIN' that corresponds to an input signal SIN. A clipping circuit clips the signal SIN' that corresponds to the input signal, to a positive limit value and to a negative limit value. A first multiplier multiplies the signal SIN' that corresponds to the input signal, by a predetermined coefficient. A first adder subtracts the output signal of the first multiplier from the output signal of the clipping circuit. A second adder sums a signal that corresponds to the output signal of the first adder and a signal that corresponds to the output signal of the absolute-value circuit. A third adder sums the input signal SIN and a signal that corresponds to the output signal of the second adder.

12 Claims, 6 Drawing Sheets

COMPARISON TECHNIQUE

GENERATOR AND GENERATION METHOD OF PSEUDO-BASS

BACKGROUND OF THE INVENTION

1. Field of the Invention

The present invention relates to a technique for pseudo-bass generation.

2. Description of the Related Art

As a method for generating bass tones below the audio bandwidth of speakers or headphones (which will collectively be referred to as a "speaker" hereafter), pseudo-bass generation is used. With the frequency of the bass tone to be reproduced as f1, by inputting, to the speaker, a frequency f2 which is double the frequency f1 and a frequency f3 which is three times the frequency f1, such an arrangement allows the user (listener) to perceive the difference (f3−f2) between these two frequencies, i.e., the frequency f1 which is the original sound.

For example, by inputting the second harmonic, i.e., 100 Hz, and the third harmonic, i.e., 150 Hz, to a speaker which is not capable of reproducing audio bands below 50 Hz, the listener will perceive the generated sound as if a sound with a fundamental frequency of 50 Hz were being reproduced.

RELATED ART DOCUMENTS

Patent Documents

[Patent Document 1]
Japanese Patent Application Laid Open No. 2005-318598
[Patent Document 2]
Japanese Patent Application Laid Open No. 2008-304670
[Patent Document 3]
Japanese Patent Application Laid Open No. 2009-44655

The inventor has investigated such a pseudo-bass generator, and has come to recognize the following problems.

FIGS. 1A and 1B are respectively a block diagram showing a configuration of a pseudo-bass generator according to a comparison technique and operation waveforms thereof. A pseudo-bass generator 200 is configured as a DSP (Digital Signal Processor). The pseudo-bass generator 200 includes HPFs (high-pass filters) 202 and 210, LPFs (low-pass filters) 204 and 218, an absolute-value circuit 206, a clipping circuit 208, multipliers 212 and 214, and adders 216 and 220. The HPFs 202 and 210 each remove low-frequency components of an input signal. The LPFs 204 and 218 each remove high-frequency components of an input signal. The adders 216 and 220 each sum two input signals. The absolute-value circuit 206 outputs the absolute value of the input signal. The clipping circuit 208 clips (clamps) the input signal to respective a positive and negative limit values and a negative limit value. The multipliers 212 and 214 each multiply the input signal by a predetermined coefficient.

FIG. 1B shows an input signal SIN, and output signals S1 and S2 output from respectively the absolute-value circuit 206 and the clipping circuit 208. The output signal S1 of the absolute-value circuit 206 includes, as the main component, the input signal (also referred to as the "fundamental component") SIN and the even harmonics including the second harmonic of the input signal SIN. The output signal S2 of the clipping circuit 208 includes, as the main component, the input signal and the odd harmonics including the third harmonic of the input signal SIN.

With such a circuit shown in FIG. 1, the signals S1 and S2 each include the fundamental component SIN. Accordingly, if the fundamental component SIN has a large amplitude, in some cases, overflow can occur. If such overflow occurs, it distorts the audio signal, leading to reduced sound quality.

SUMMARY OF THE INVENTION

The present invention has been made in order to solve such a problem. Accordingly, it is an exemplary purpose of an embodiment of the present invention to provide a pseudo-bass generator which is capable of suppressing reduction in sound quality.

An embodiment of the present invention relates to a pseudo-bass generator. The pseudo-bass generator comprises: an absolute-value circuit configured to output the absolute value of a signal that corresponds to an input signal; a clipping circuit configured to clip a signal that corresponds to the input signal to a positive limit value and to a negative limit value; a first multiplier configured to multiply a signal that corresponds to the input signal by a predetermined coefficient; a first adder configured to subtract an output signal of the first multiplier from an output signal of the clipping circuit; a second adder configured to sum a signal that corresponds to an output signal of the first adder and a signal that corresponds to an output signal of the absolute-value circuit; and a third adder configured to sum the input signal and a signal that corresponds to an output signal of the second adder. The pseudo-bass generator outputs, as an output signal, a signal that corresponds to an output signal of the third adder.

With such an embodiment, the first adder attenuates the fundamental component of the output signal of the clipping circuit. Thus, such an arrangement suppresses the occurrence of overflow in each adder even if the fundamental component has a high amplitude, thereby suppressing reduction in sound quality.

The signal represented by "a signal B that corresponds to a signal A" may be supplied as the signal A itself, or may be supplied as a signal obtained by performing signal processing on the signal A.

Also, the respective positive limit value and negative limit value to be set for the clipping circuit may be set to respective values obtained by multiplying a positive peak value and a negative peak value by $\beta$ ($\beta$ is a real constant). With such an arrangement, the constant $\beta$ and the aforementioned predetermined coefficient $\alpha$ are preferably set such that they satisfy the relation $0.95<\alpha+\beta<1.25$.

When this relation is satisfied, such an arrangement is capable of appropriate attenuation of the fundamental component.

Another embodiment of the present invention also relates to a pseudo-bass generator. The pseudo-bass generator comprises: an absolute-value circuit configured to output the absolute value of a signal that corresponds to an input signal; a lipping circuit configured to clip a signal that corresponds to the input signal to a positive limit value and to a negative limit value; a first multiplier configured to multiply a signal that corresponds to the input signal by a predetermined coefficient; a first adder configured to subtract an output signal of the first multiplier from an output signal of the absolute-value circuit; a second adder configured to sum a signal that corresponds to an output signal of the first adder and a signal that corresponds to an output signal of the clipping circuit; and a third adder configured to sum the input signal and a signal that corresponds to an output signal of the second adder. The pseudo-bass generator outputs, as an output signal, a signal that corresponds to an output signal of the third adder.

With such an embodiment, the first adder attenuates the fundamental component of the output signal of the absolute-value circuit. Thus, such an arrangement suppresses the occurrence of overflow in each adder and in the downstream signal processing steps even if the fundamental component has a high amplitude, thereby suppressing reduction in the sound quality.

Yet another embodiment of the present invention also relates to a pseudo-bass generator. The pseudo-bass generator comprises: an absolute-value circuit configured to output the absolute value of a signal that corresponds to an input signal; a clipping circuit configured to clip a signal that corresponds to the input signal to a positive limit value and to a negative limit value; a second adder configured to sum a signal that corresponds to the output signal of the absolute-value circuit and a signal that corresponds to the output signal of the clipping circuit; a third adder configured to sum the input signal and a signal that corresponds to the output signal of the second adder; and an output high-pass filter configured to cut, from the output signal of the third adder, frequency components to be reproduced in a pseudo-sound generating manner.

With such an embodiment, the fundamental component of the output signal of the absolute-value circuit can be attenuated by means of the output high-pass filter. Thus, such an arrangement suppresses overflow occurrence in the downstream signal processing steps even if the fundamental component has a high amplitude, thereby suppressing reduction in the sound quality.

The pseudo-bass generator may be monolithically integrated on a single semiconductor substrate. Examples of "arrangements monolithically integrated" include: an arrangement in which all the elements of a circuit are formed on a single semiconductor substrate; and an arrangement in which principal elements of a circuit are monolithically integrated. Also, a part of the resistors, capacitors, and so forth, for adjusting circuit constants, may be provided as elements external of the semiconductor substrate.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

First Embodiment

Figure 2:
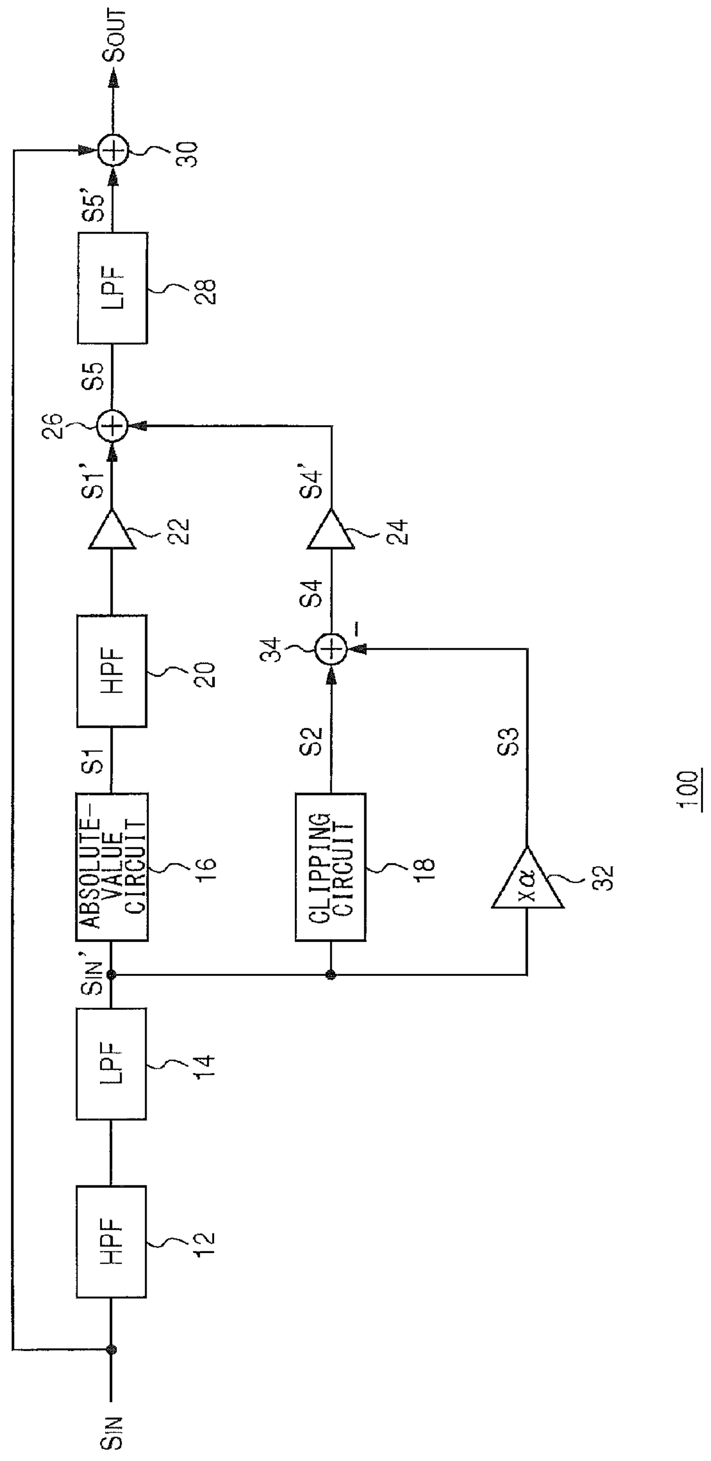
FIG. 2 is a block diagram which shows a configuration of a pseudo-bass generator according to a first embodiment.

FIG. 2 is a block diagram which shows a configuration of a pseudo-bass generator 100 according to a first embodiment. The pseudo-bass generator 100 receives a digital audio input signal (which will simply be referred to as the "input signal" hereafter) SIN, and performs signal processing on the input signal thus received so as to perform pseudo-bass reproduction processing. The output signal SOUT of the pseudo-bass generator 100 is converted into an analog audio signal by means of an unshown D/A converter provided as a downstream component. The resulting analog audio signal is supplied to an unshown electroacoustic transducer such as a speaker, headphones, or the like. The aforementioned electroacoustic transducer has a limited ability to reproduce sound in the bass band. For example, the electroacoustic transducer is not capable of reproducing frequency components that are lower than 50 Hz or 100 Hz (which will be referred to as the "irreproducible low frequency" hereafter). Even in such a situation, the pseudo-bass generator 100 allows the user to perceive the generated sound as if the irreproducible low frequency signal were being reproduced via the speaker.

Description will be made below regarding a configuration of the pseudo-bass generator 100. The pseudo-bass generator 100 includes a first HPF 12, a first LPF 14, an absolute-value circuit 16, a clipping circuit 18, a second HOF 20, a second multiplier 22, a third multiplier 24, a second adder 26, a second LPF 28, a third adder 30, a first multiplier 32, and a first adder 34.

The first LPF 14 cuts, from the input signal SIN, the frequency components that are higher than the frequency component to be reproduced in a pseudo-bass generating manner, i.e., the frequency components that are higher than the irreproducible low frequency. The term "cut" as used here refers not only to complete removal of the target frequency components, but also to attenuation of the target frequency components. The first LPF 14 extracts the irreproducible low frequency signal. The first HPF 12 cuts the frequency components (extremely low frequency components) that are lower than the frequency components to be reproduced via pseudo-bass generation. By providing the first HPF 12, such an arrangement allows downstream circuits to perform signal processing with high efficiency.

The signal corresponding to the input signal SIN thus output via the first HPF 12 and the first LPF 14 will be referred to as the "fundamental low frequency signal SIN'". The positions of the first HPF 12 and the first LPF 14 may be exchanged.

The absolute-value circuit 16 receives the fundamental low frequency signal SIN'. The absolute-value circuit 16 outputs the absolute value (which will be referred to as the "first signal" hereafter) S1 of the fundamental low frequency signal SIN'. That is to say, the fundamental low frequency signal SIN' is subjected to full-wave rectification by means of the absolute-value circuit 16. The second HPF 20 cuts the DC component of the first signal S1. The second multiplier 22 multiplies the output signal of the second multiplier 22 by a predetermined coefficient.

The clipping circuit 18 clips the input signal SIN' to respective positive and negative limit values. The positive and negative limit values are each set to a value obtained by multiplying the corresponding peak level (positive or negative peak level) by β (0<β<1). For example, β is set to 0.7.

The first multiplier 32 multiplies the input signal SIN' by a predetermined coefficient α. When β=0.7, α is preferably set to 0.3 to 0.5.

The first adder 34 subtracts the output signal (third signal) S3 of the first multiplier 32 from the output signal (second signal) S2 of the clipping circuit 18. The third multiplier 24 multiplies the output signal (fourth signal) S4 of the first adder 34 by a predetermined coefficient.

The second adder 26 sums the output signal S1' of the second multiplier 22 which corresponds to the first signal S1 and the output signal S4' of the third multiplier which corresponds to the fourth signal S4, thereby generating a fifth signal S5. The second LPF 28 cuts, from the fifth signal S5, the fourth and higher harmonics of the irreproducible low frequency. Because the higher harmonics components of the fundamental low frequency signal SIN' are essentially distortion components, by cutting the frequency components of the fourth and higher harmonics, which are harmonics other than the second harmonic and the third harmonic which are required for the pseudo-bass reproduction, such an arrangement reduces distortion.

The third adder 30 sums the original input signal SIN and the signal S5' that corresponds to the fifth signal S5 that passes through the second LPF 28. The pseudo-bass generator 100 outputs, to a downstream circuit, the signal SOUT that corresponds to the output signal of the third adder 30.

The above is the configuration of the pseudo-bass generator 100. Next, description will be made regarding the operation thereof.

Figure 3:
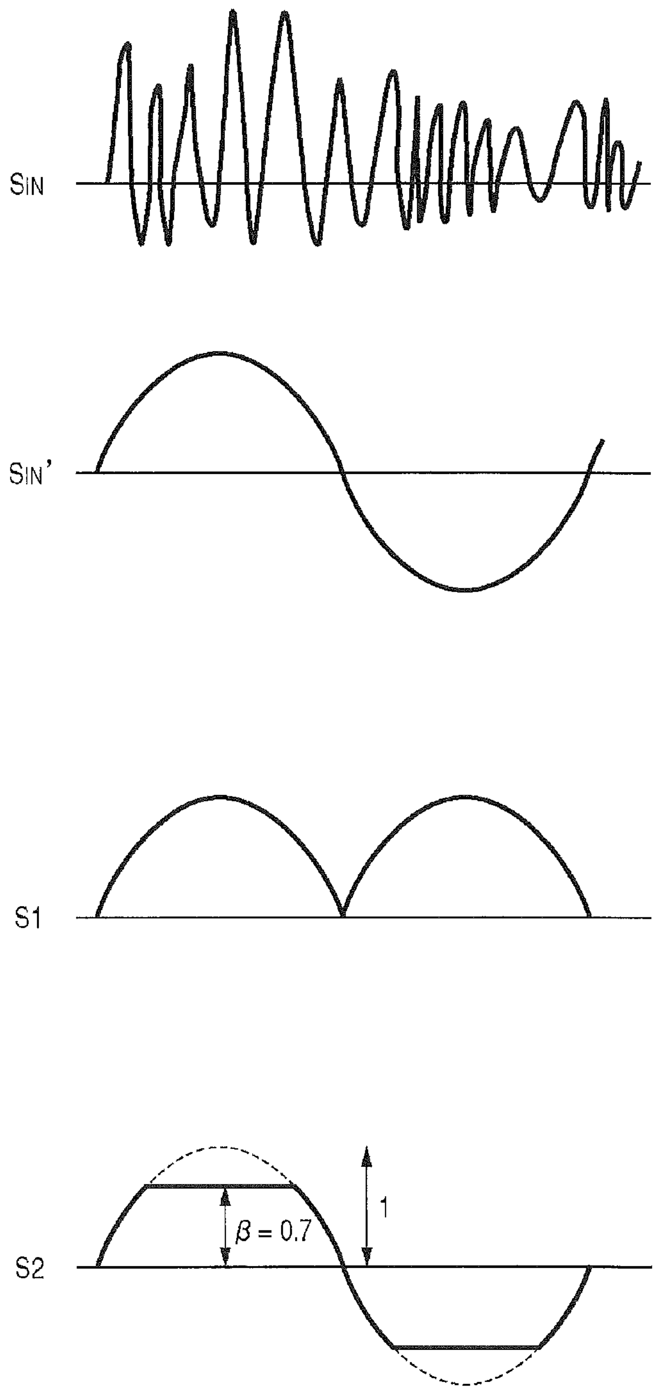
FIG. 3 is an operation waveform diagram for the pseudo-bass generator shown in FIG. 2.

FIG. 3 is a diagram of the operation waveforms of the pseudo-bass generator 100 shown in FIG. 2. The vertical axis and the horizontal axis in FIG. 3 are expanded or reduced as appropriate for ease of understanding. Also, each waveform shown in this drawing is simplified for ease of understanding. The same can be said of the other drawings. The input signal SIN is an audio signal including frequency components ranging from a low-frequency component on the order of 20 Hz to a high-frequency component on the order of 17 kHz.

The fundamental low-frequency signal SIN' includes an irreproducible low-frequency component on the order of 50 Hz to 100 Hz, which is to be reproduced via pseudo-bass generation. For ease of understanding, FIG. 3 shows only a single frequency spectrum component extracted from the irreproducible low-frequency signal SIN'.

As shown in FIG. 3, the second signal S2 has a waveform obtained by clipping (clamping) the fundamental low-frequency signal SIN'. Accordingly, the waveform of the second signal S2 is similar to that of the fundamental low-frequency signal SIN'. Thus, the second signal S2 includes a large spectrum component of the irreproducible low-frequency component. As the parameter β approaches 1, the spectrum component of the irreproducible low-frequency component rises.

Figure 1A:
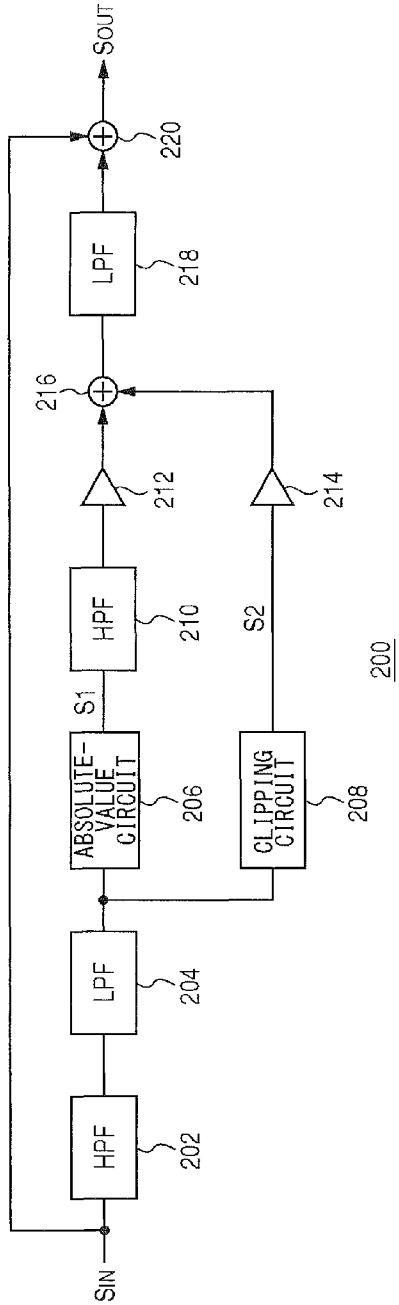
FIGS. 1A and 1B are respectively a block diagram showing a configuration of a pseudo-bass generator according to a comparison technique and operation waveforms thereof.
Figure 1B:
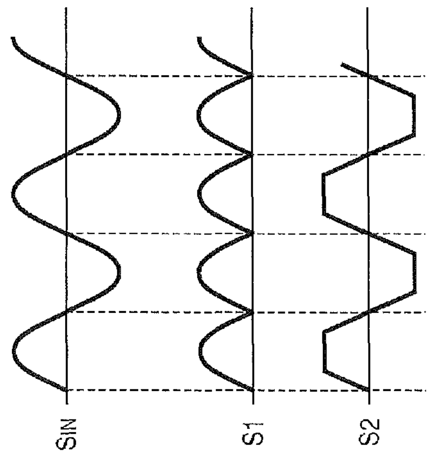

With the pseudo-bass generator 200 according to the comparison technique shown in FIG. 1, the irreproducible low-frequency component included in the second signal S2 has a high amplitude. Accordingly, overflow problems often occur in the adder 216, the adder 220, and the downstream circuits.

In contrast, with the pseudo-bass generator 100 shown in FIG. 2, the third signal S3, which is obtained by multiplying the fundamental low-frequency signal SIN' by α, is subtracted from the second signal S2. Such an arrangement removes the irreproducible low-frequency component, thereby reducing the amplitude of the effective signal. As a result, such an arrangement suppresses the occurrence of overflow in the internal components of the pseudo-bass generator 100 and the downstream components. By suppressing the occurrence of overflow, such an arrangement suppresses reduction in the sound quality. It should be noted that the irreproducible low-frequency component cannot be directly reproduced via a speaker or headphones provided as a downstream component. Thus, the removal of such an irreproducible low-frequency component has almost no effect on auditory perception.

Figure 4:
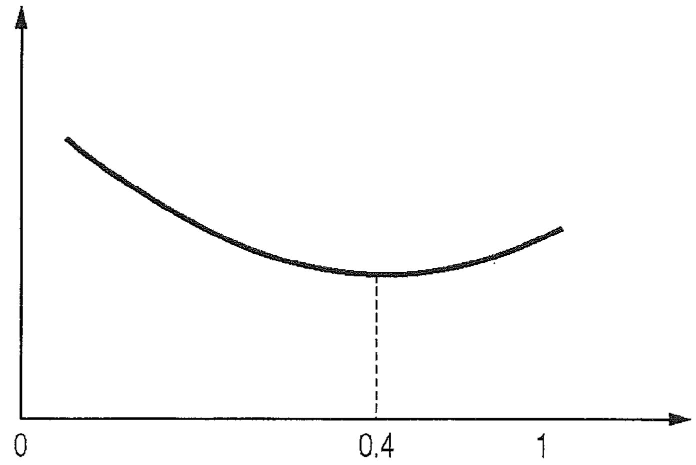
FIG. 4 is a graph which shows the relation between the coefficient $\alpha$ and the magnitude of the spectrum component of the irreproducible low frequency component included in the output signal of the pseudo-bass generator shown in FIG. 2.

With the pseudo-bass generator 100 shown in FIG. 2, the efficiency of the function of removing the irreproducible low-frequency component, which is provided by the first multiplier 32 and the first adder 34, changes according to the parameter β set for the clipping circuit 18 and the coefficient α set for the first multiplier 32. FIG. 4 is a graph which shows the relation between the coefficient α and the magnitude of the spectrum component of the irreproducible low frequency component included in the output signal SOUT of the pseudo-bass generator 100 shown in FIG. 2. FIG. 4 shows the relation in an arrangement in which β=0.7.

In this case, an arrangement in which α is set to 0.4 is capable of removing the irreproducible low frequency component with the highest efficiency, which is desirable. For practical purposes, α is preferably set to a value on the order of 0.3 to 0.5.

The suitable value of the coefficient α changes according to change in the parameter β. The present inventor has investigated the combination of these two parameters, and has come to recognize that, when the relation 0.95<α+β<1.25 is satisfied, such an arrangement is capable of removing the irreproducible low frequency component with high efficiency. For example, if β=0.8, α is preferably set to a value on the order of 0.15 to 0.45.

Second Embodiment

Figure 5:
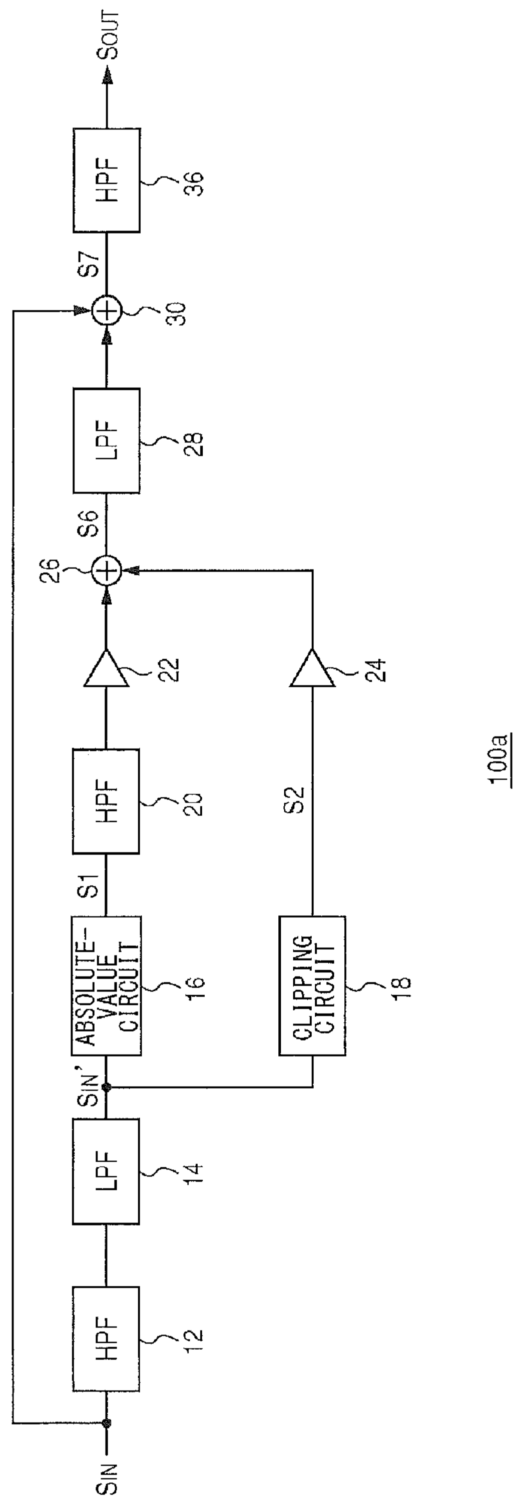
FIG. 5 is a block diagram which shows a configuration of a pseudo-bass generator according to a second embodiment.

FIG. 5 is a block diagram which shows a configuration of a pseudo-bass generator 100*a* according to a second embodiment. The pseudo-bass generator 100*a* has the same configuration as that of the pseudo-bass generator 100 shown in FIG. 2, except that it does not include the first multiplier 32 and the first adder 34, and instead includes an output high-pass filter 36.

The second adder 26 sums a signal that corresponds to the output signal S1 of the absolute-value circuit 16 and a signal that corresponds to the output signal S2 of the clipping circuit 18. The second LPF 28 cuts, from the output signal S6 of the second adder 26, the frequency components that are higher than the fourth harmonic of the irreproducible low frequency. The third adder 30 sums the output signal of the second LPF 28 and the original audio signal SIN. The output high-pass filter 36 cuts, from the output signal (seventh signal) S7 of the third adder 30, the irreproducible low frequency component, which is to be reproduced via pseudo-bass generation. That is to say, there is a difference between the pseudo-bass generator 100 shown in FIG. 2 and the pseudo-bass generator 100*a* shown in FIG. 5 in terms of the position at which the irreproducible low frequency component is to be cut. The pseudo-bass generator 100*a* shown in FIG. 5 is capable of suppressing overflow that can occur in a circuit provided as a downstream component of the pseudo-bass generator 100*a*.

Figure 6A:
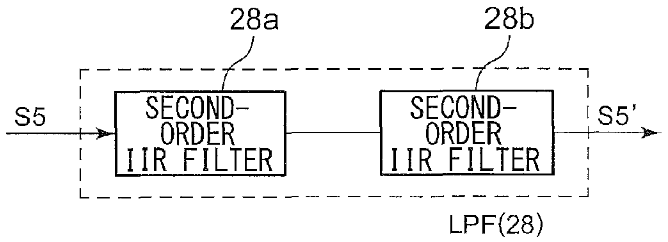
FIGS. 6A and 6B are block diagrams showing an example configuration of a second LPF shown in FIG. 2.
Figure 6B:
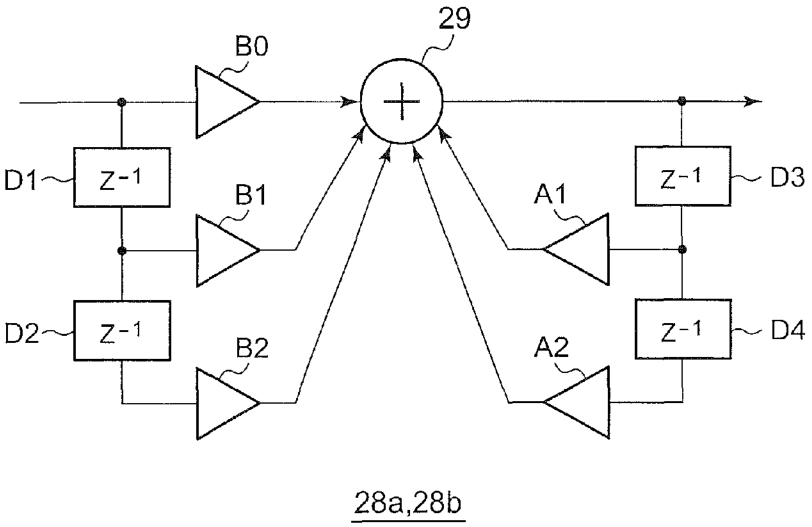

FIGS. 6A and 6B are block diagrams showing an example configuration of the second LPF 28 shown in FIG. 2. As shown in FIG. 6A, the second LPF 28 includes two second-order IIR (Infinite Impulse Response) filters 28*a* and 20*b* connected in series. By setting either one of these two IIR filters, e.g., the downstream filter, to the pass-through state, the second LPF 28 can be used as a second-order filter.

FIG. 6B shows a configuration of a second order IIR filter. The second order IIR filter includes multiple delay elements D1 through D4, an adder 29, and coefficient circuits B0 through B2, and A1 and A2. The delay elements each delay an input signal. The coefficient circuits B0 through B2 and A1 and A2 multiply an input value by, respectively, coefficients B0 through B2 and A1 and A2. The adder 29 sums the output signals of the coefficient circuits B0 through B2 and A1 and A2. In order to set the second order IIR filter to the pass-through state, B0 should be set to 1, and A1, A2, B1, and B2 are each set to the same value.

Description has been made regarding the present invention with reference to the embodiment. The above-described embodiment has been described for exemplary purposes only, and is by no means intended to be interpreted restrictively. Rather, various modifications may be made by making various combinations of the aforementioned components or processes. Description will be made below regarding such modifications.

As an example, a modification may be made by combining the pseudo-bass generator 100 shown in FIG. 2 with the pseudo-bass generator 100*a* shown in FIG. 5. That is to say, the output high-pass filter 36 may be arranged as a downstream component of the pseudo-bass generator 100 shown in FIG. 2.

Also, with the pseudo-bass generator 100 shown in FIG. 2, the first adder 34 may be arranged as a downstream component of the absolute-value circuit 16 or the second HPF 20. With such an arrangement, the first adder 34 may subtract the third signal S3 from a signal that corresponds to the first signal S1, and may output the resulting signal to the second multiplier 22. Such an arrangement is capable of appropriately suppressing the occurrence of overflow.

The frequency values in the embodiment also have been given for exemplary purposes only, and are by no means intended to be interpreted restrictively. It is needless to say that the frequency values should be adjusted according to the kind of speaker and the performance thereof.

While the preferred embodiments of the present invention have been described using specific terms, such description is for illustrative purposes only, and it is to be understood that changes and variations may be made without departing from the spirit or scope of the appended claims.

What is claimed is:

1. A pseudo-bass generator comprising:

an absolute-value circuit configured to generate a first signal indicating an absolute value of a signal that corresponds to an input signal;

a clipping circuit configured to generate a second signal by clipping said signal that corresponds to the input signal to a positive limit value and to a negative limit value;

a first multiplier configured to generate a third signal by multiplying said signal that corresponds to the input signal by a predetermined coefficient;

a first adder configured to generate a fourth signal by subtracting the third signal from the second signal;

a second adder configured to generate a fifth signal by summing a signal that corresponds to the fourth signal and a signal that corresponds to the first signal, the signal that corresponds to the first signal has a signal level that corresponds to the absolute value of said signal that corresponds to the input signal; and a third adder configured to sum the input signal and a signal that corresponds to the fifth signal, wherein the pseudo-bass generator outputs, as an output signal, a signal that corresponds to an output signal of the third adder.

2. A pseudo-bass generator according to claim 1, wherein the respective positive limit value and negative limit value to be set for the clipping circuit are set to respective values obtained by multiplying a positive peak value and a negative peak value by β (β is a real constant), and wherein the constant β and the aforementioned predetermined coefficient α satisfy the relation $0.95<\alpha+\beta<1.25$.

3. A pseudo-bass generator according to claim 1, wherein said signal that corresponds to the input signal is a signal obtained by cutting, from the input signal, frequency components that are higher than the frequency component to be reproduced via pseudo-bass generation.

4. A pseudo-bass generator according to claim 1, wherein said signal that corresponds to the input signal is a signal obtained by cutting, from the input signal, frequency components that are lower than the frequency component to be reproduced in a pseudo-bass generating manner.

5. A pseudo-bass generator according to claim 1, wherein the signal that corresponds to the first signal is a signal obtained by removing a DC component from the first signal.

6. A pseudo-bass generator according to claim 1, wherein the signal that corresponds to the output signal of the third adder is a signal obtained by cutting, from the output signal of the third adder, frequency components that are equal to or higher than four times the frequency component to be reproduced via pseudo-bass generation.

7. A pseudo-bass generator according to claim 6, further comprising a low-pass filter configured to cut, from the output signal of the third adder, the frequency components that are equal to or higher than four times the frequency component to be reproduced via pseudo-bass generation, wherein the low-pass filter comprises two second-order IIR (infinite impulse response) filters connected in series.

8. A pseudo-bass generator according to claim 7, wherein the second-order IIR filter comprises:

a first delay element configured to delay an input signal of the second-order IIR filter;

a second delay element configured to delay an output signal of the first delay element;

a third delay element configured to delay an output signal of the second-order IIR filter;

a fourth delay element configured to delay an output signal of the third delay element;

a first coefficient circuit configured to multiply the input signal by a first coefficient;

a second coefficient circuit configured to multiply the output of the first delay element by a second coefficient;

a third coefficient circuit configured to multiply the output of the second delay element by a third coefficient;

a fourth coefficient circuit configured to multiply the output signal of the third delay element by a fourth coefficient;

a fifth coefficient circuit configured to multiply the output signal of the fourth delay element by a fifth coefficient; and an adder configured to sum the output signals of the first through fifth circuits, thereby generating an output signal.

9. A pseudo-bass generation method comprising:

generating a first signal indicating absolute value of a signal that corresponds to an input signal;

generating a second signal by clipping said signal that corresponds to the input signal to a positive limit value and to a negative limit value;

generating a third signal by multiplying said signal that corresponds to the input signal by a predetermined coefficient;

generating a fourth signal by subtracting the third signal from the second signal;

generating a fifth signal by summing a signal that corresponds to the first signal and a signal that corresponds to the fourth signal, the signal that corresponds to the first signal has a signal level that corresponds to the absolute value of said signal that corresponds to the input signal; and summing the input signal and a signal that corresponds to the fifth signal.

10. A pseudo-bass generation method according to claim 9, wherein the respective positive limit value and negative limit value are set to respective values obtained by multiplying a positive peak value and a negative peak value by β (β is a real constant), and wherein the constant β and the aforementioned predetermined coefficient α satisfy the relation $0.95<\alpha+\beta<1.25$.

11. A pseudo-bass generator comprising:

an absolute-value circuit configured to generate a first signal indicating an absolute value of a signal that corresponds to an input signal;

a clipping circuit configured to generate a second signal by clipping said signal that corresponds to the input signal to a positive limit value and to a negative limit value;

a second adder configured to generate a sixth signal by summing a signal that corresponds to the first signal and a signal that corresponds to the second signal;

a third adder configured to generate a seventh signal by summing the input signal and a signal that corresponds to the sixth signal; and an output high-pass filter configured to cut, from the seventh signal, frequency components to be reproduced in a pseudo-sound generating manner.

12. A pseudo-bass generation method comprising:

generating a first signal indicating an absolute value of a signal that corresponds to an input signal;

generating a second signal by clipping said signal that corresponds to the input signal to a positive limit value and to a negative limit value;

generating a sixth signal by summing a signal that corresponds to the first signal and a signal that corresponds to the second signal;

generating a seventh signal by summing the input signal and a signal that corresponds to the sixth signal; and cutting, from the seventh signal, a frequency component to be reproduced via pseudo-bass generation.

* * * * *